(12) United States Patent
Symanczyk et al.

(10) Patent No.: US 7,737,428 B2
(45) Date of Patent: Jun. 15, 2010

(54) MEMORY COMPONENT WITH MEMORY CELLS HAVING CHANGEABLE RESISTANCE AND FABRICATION METHOD THEREFOR

(75) Inventors: Ralf Symanczyk, Munich (DE); Thomas Roehr, Aschheim (DE)

(73) Assignee: Qimonda AG, Munich (DE)

( * ) Notice: Subject to any disclaimer, the term of this patent is extended or adjusted under 35 U.S.C. 154(b) by 61 days.

(21) Appl. No.: 11/214,692

(22) Filed: Aug. 29, 2005

(65) Prior Publication Data

US 2006/0060832 A1 Mar. 23, 2006

(30) Foreign Application Priority Data

Aug. 30, 2004 (DE) .................. 10 2004 041 894

(51) Int. Cl.
*H01L 47/00* (2006.01)
*H01L 23/48* (2006.01)
*H01L 23/52* (2006.01)
*H01L 29/40* (2006.01)

(52) U.S. Cl. ............... 257/3; 257/4; 257/774; 257/E45.002; 438/102; 438/602; 438/900

(58) Field of Classification Search ............ None
See application file for complete search history.

(56) References Cited

U.S. PATENT DOCUMENTS

| 6,566,700 | B2 * | 5/2003 | Xu ..................... 257/296 |
|---|---|---|---|
| 2002/0118027 | A1 | 8/2002 | Routkevitch et al. |
| 2003/0194865 | A1 * | 10/2003 | Gilton .................. 438/689 |
| 2004/0026682 | A1 * | 2/2004 | Jiang ..................... 257/4 |
| 2004/0042265 | A1 * | 3/2004 | Moore et al. ............. 365/163 |
| 2004/0052117 | A1 * | 3/2004 | Jiang .................... 365/200 |
| 2004/0113135 | A1 * | 6/2004 | Wicker ................... 257/2 |
| 2005/0019975 | A1 * | 1/2005 | Lee et al. ................ 438/95 |
| 2006/0163553 | A1 * | 7/2006 | Liang .................... 257/3 |
| 2006/0208847 | A1 * | 9/2006 | Lankhorst et al. ........... 338/9 |

FOREIGN PATENT DOCUMENTS

| DE | 19515492 | 10/1996 |
|---|---|---|
| WO | 03079463 | 9/2003 |
| WO | 2004057676 | 7/2004 |

OTHER PUBLICATIONS

M.N. Kozicki et al., "Applications of Programmable Resistance Changes in Metal-Doped Chalcogenides", *Electrochemical Society Proceedings*, vol. 99, pp. 298-309.

(Continued)

*Primary Examiner*—Andy Huynh
*Assistant Examiner*—Hoang-Quan T Ho
(74) *Attorney, Agent, or Firm*—Dicke, Billig & Czaja, PLLC

(57) ABSTRACT

The invention relates to a memory component having memory cells based on an active solid electrolyte material which can be changed in terms of its resistance value. The active solid electrolyte material is embedded between a bottom and top electrode, can be switched between an on state with a low resistance and an off state with a high resistance by comparison therewith by application of a suitable electric field between said electrodes. A resistance material is embedded in parallel with the solid electrolyte material between the electrodes.

21 Claims, 7 Drawing Sheets

OTHER PUBLICATIONS

Kai Liu et al., "Fabrication and Thermal Stability of Arrays of Fe Nanodots", *Applied Physics Letters*, vol. 81, No. 23, pp. 4434-4436, Dec. 2, 2002.

Hideki Masuda et al., "Ordered Metal Nanohole Arrays Made by a Two-Step Replication of Honeycomb Structures of Anodic Alumina", *Science*, vol. 268, pp. 1466-1468, Jun. 9, 1995.

Ron Neale, "Micron to Look Again at Non-Volatile Amorphous Memory", 6 pages.

Ralf Symanczyk et al., "Electrical Characterization of Solid State Ionic Memory Elements", 7 pages.

B. Prince, "Emerging Memories—Technology and Trends", (2 pgs.).

European Search Report Application No. EP 05 10 7162 mailed Jul. 16, 2007 (3 pages).

* cited by examiner

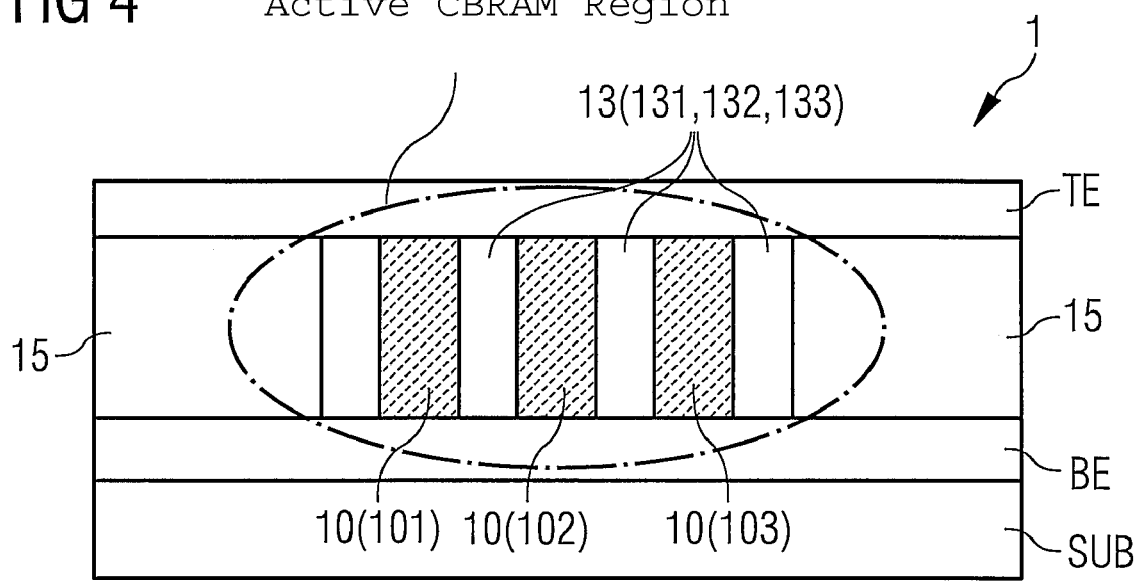
FIG 4  Active CBRAM Region

MEMORY COMPONENT WITH MEMORY CELLS HAVING CHANGEABLE RESISTANCE AND FABRICATION METHOD THEREFOR

CROSS-REFERENCE TO RELATED APPLICATION

This Utility Patent Application claims priority to German Patent Application No. DE 10 2004 041 894.2, filed on Aug. 30, 2004, which is incorporated herein by reference.

BACKGROUND

The invention relates to a memory component (CBRAM) having memory cells based on an active solid electrolyte material having a changeable resistance value and which, embedded between a bottom and top electrode, can be switched between an on state with a low resistance and an off state with a high resistance by comparison therewith by application of a suitable electric field between said electrodes, and to a fabrication method therefor.

Various semiconductor memory technologies based on the principle of switching the electrical resistance are currently being researched intensively. One promising concept based on a solid electrolyte material is also known in the literature as PMC (Programmable Metallization Cell) or CBRAM (Conductive Bridging Random Access Memory) (cf.: M. N. Kozicki, M. Yun, L. Hilt, A. Singh, Applications of programmable resistance changes in metal-doped chalcogenides, Electrochemical Society Proc., Vol. 99-13 (1999) 298; R. Neale, Micron to look again at non-volatile amorphous memory, Electron Engineering Design (2002); B. Prince, Emerging Memories—Technologies and Trends, Kluwer Academic Publishers (2002); R. Symanczyk et al. Electrical Characterization of Solid State Ionic Memory Elements, Proceedings Non-Volatile Memory Technology Symposium (2003) 17-1).

The functional principle makes use of the formation and the clearing of a low-resistance channel in a high-resistance solid electrolyte material upon application of suitable electrical fields. A resistive switching between the high-resistance state and a low-resistance state is thereby possible. The two resistance values can respectively be assigned a logic state.

Very high ratios of the off resistance to the on resistance are achieved in the case of the abovementioned CBRAM memory cells, due to the very high-resistance state of the solid electrolyte material in the non-programmed state. Typical values are $R(off)/R(on)>10^6$ given $R(off)>10^{10}\Omega$ and an active cell area <1 µm². At the same time, this technology is characterized by low switching voltages of less than 100 mV for initiating the erase operation and less than 300 mV for the write operation.

When realizing a cell array with evaluation and drive logic, however, the high resistance values are associated with a number of disadvantages:

sensitivity toward interference voltages;
large feedback resistance in a typical sense amplifier and thus a high area requirement in the case of embodiment in CMOS technology; and
high RC time constants.

The interference susceptibility of a cell with extremely high R(off) is particularly critical. Since even the resistance of a switched-off field effect transistor is in the region of $10^{10}\Omega$, a circuit node between such a transistor and a high-resistance CBRAM memory cell is practically completely isolated and thus very sensitive toward instances of capacitive coupling in. Moreover, even extremely low leakage currents lead to the build-up of interference voltages. Both effects may result in an undesirable programming of the CBRAM cell.

Furthermore, the cells exhibit degradation of the off state over the service life, particularly under stress conditions such as endurance tests. This degradation is manifested in a reduction of the off resistance and means an undesirable inhomogeneity of the cell characteristic values in a memory array and over the operation period of the component.

Further memory concepts exist which are based on memory cells that can be switched in terms of their resistance value, such as, for example, MRAM or PCRAM memories. In the case of these concepts, the off/on resistance ratio and also the switch-off resistance are significantly lower in comparison with a CBRAM. The problem area described here does not occur in this form in these other memory concepts. Off/on resistance ratios of up to 70% are achieved in an MRAM, and in a PCRAM the values are typically in the region of less than $10^3$ with an R(off) of less than 1 MΩ.

SUMMARY

One embodiment of the invention enables a memory component of the type mentioned in the introduction in which the susceptibility of the cells to interference and also the sensitivity toward instances of capacitive coupling in are reduced and the cell ageing effect outlined previously is suppressed, so that the effect is no longer measurable externally. One embodiment specifies a method for fabricating such a CBRAM memory component.

In one embodiment of the invention, the off resistance of the cells is defined by the layout and the fabrication method. This is achieved by means of a parallel resistance with respect to the active layer. The off resistance and the off/on resistance ratio are thus no longer solely determined by the material properties of the layer of the active solid electrolyte material, but rather can be adapted to the requirements of the evaluation logic and the desired application. The disadvantages outlined above which are due to the high off resistance of the cell are obviated. Furthermore, the off resistance of the cells can be set in such a way that the ageing effect of the solid electrolyte material is no longer measurable externally. If the off resistance of a cell is set to a value of $10^7\Omega$ during fabrication, by way of example, then degradations of the resistance of the active solid electrolyte material from $10^{10}\Omega$ to $10^8\Omega$ are negligible for the circuit and operation and are to be regarded as constant.

One embodiment of the invention utilizes the implementation of a resistance in parallel with the active layers for each cell of a memory array. This additional parallel resistance is set, through suitable process control and material selection, to a resistance value lying between the on resistance and the off resistance of the active solid electrolyte material. Externally, therefore, the on resistance of the cell is defined by the channel formation in the active material and the off resistance is defined by the layout or the parallel resistance.

One embodiment of the invention specifies a fabrication method. This fabrication method is based on a self-patterning mask process by means of anodic oxidation of aluminum. This oxidation leads to the formation of a hexagonal dense lattice in the nanometers range. Depending on the exemplary embodiment, a resistance material having a suitable resistivity is chosen either for the supporting structure or for the filling of the nanopores formed, thereby producing the desired parallel resistance.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 4 illustrates a cross section through a CBRAM memory component according to one embodiment of the invention.

DETAILED DESCRIPTION

Figure 1A:
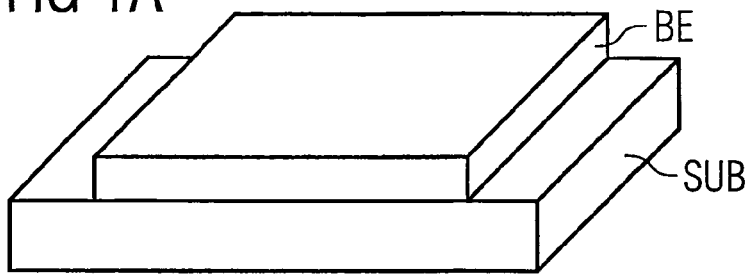
FIGS. 1A-1G illustrate schematic sectional views for elucidating individual process steps of an exemplary embodiment of a fabrication method according to the invention for a CBRAM memory component.
Figure 1B:
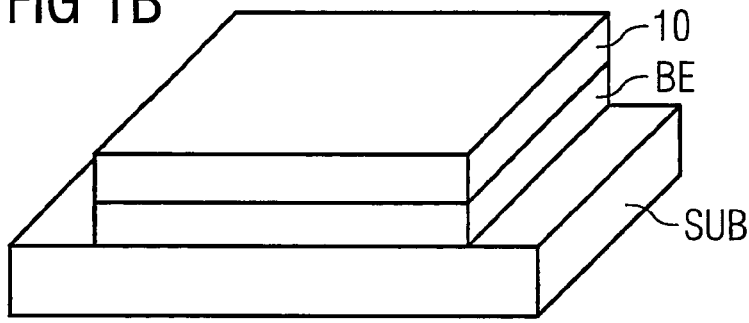
Figure 1C:
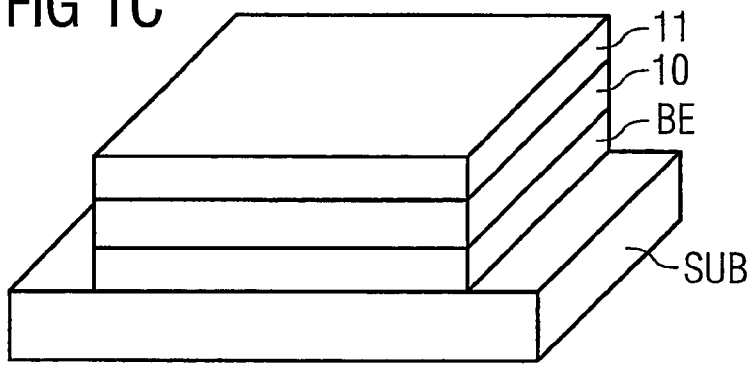
Figure 1D:
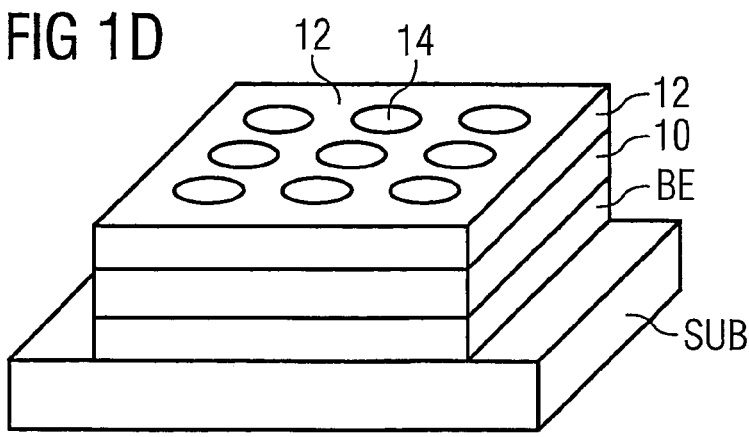

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

FIG. 4 illustrates a CBRAM memory component according to one embodiment of the invention having memory cells 1 based on an active solid electrolyte material 13 or 131, 132, 133 which can be changed in terms of its resistance value and which, embedded between a bottom electrode BE (Bottom Electrode) and a top electrode TE (Top Electrode), can be switched between an on state having a low resistance and an off state having a high resistance in comparison therewith by application of a suitable electric field between said electrodes BE, TE. A resistance material 10 or 101, 102, 103 is embedded in parallel with the solid electrolyte material 13, 131, 132, 133 in the active CBRAM region between the electrodes BE, TE. Laterally, the memory cell 1 is patterned by the embedding of the layer stack in a dielectric layer 15 for the insulation of adjacent cells.

The measures proposed according to one embodiment of the invention mean that the resistance value of the resistance material is adjustable. In one case the resistance value is set to a value lying between the resistance value of the active solid electrolyte material in the on state and in the off state. While it is readily understandable that the resistance value of the resistance material can be set through the choice of its resistivity, in the case of one embodiment of the invention the resistance value of the resistance material is additionally set by means of a suitable layout of its layer and/or by means of a suitable layout of the solid electrolyte material between the electrodes.

The exemplary embodiments of the fabrication method according to the invention that are described below use an aluminum oxide layer having nanopores that function as a positive mask or as a negative mask for patterning the resistance material and the layer of the solid electrolyte material between the electrodes. The anodic oxidation of an aluminum layer in suitable electrolytes (that is, oxalic acid, sulfuric acid) leads, depending the choice of layer thickness and etching conditions, such as etching time, electrical voltage, chemical concentration, to homogeneous, hexagonally dense arrangements of pores having diameters down to 4 nm (cf.: H. Masuda and K. Fukuda, Ordered Metal Nanohole Arrays Made by a Two-Step Replication of Honeycomb Structures of Anodic Alumina, Science 268, 1995; K. Liu et al., Fabrication and thermal stability of arrays of Fe nanodots, Appl. Phys. Lett. 81, 2002). This arrangement serves as a mask for the deposition of the active material and of the material for the parallel resistance; to be precise, a distinction can be made between a method with a positive mask and a method with a negative mask depending on the process control.

One exemplary embodiment of a fabrication method according to the invention is described below with reference to FIGS. 1A-1G. This fabrication method uses the abovementioned aluminum oxide layer with the nanopores as a positive mask for the patterning of the resistance material for the parallel resistance and also for the patterning of the solid electrolyte material for the active layer.

Firstly, in accordance with FIG. 1A, the metallization for the bottom electrode BE is deposited on a substrate SUB and patterned. By way of example, tungsten, TiN, TiW, TiAlN or others may be used as electrode metal. In accordance with FIG. 1B a layer 10 made of a conductive resistance material for the parallel resistance is deposited on the bottom electrode BE. An aluminum layer 11 is deposited above that in accordance with FIG. 1C and is oxidized anodically in accordance with FIG. 1D and converted in the process into a nanoporous $Al_2O_3$ layer 12 with nanopores 14. The resulting nanopores 14 have a mean diameter of down to 4 nm and a typical diameter of approximately 10 nm.

Figure 1E:
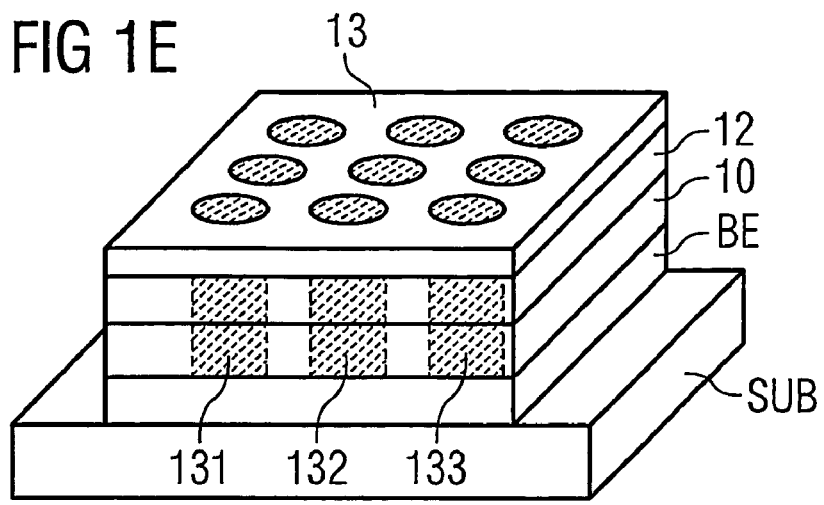

In accordance with FIG. 1E, firstly the resistance material of the layer 10 is etched through the nanopores 14 of the $Al_2O_3$ layer 12, so that nanopores also arise in the layer 10 of the resistance material. Afterward, likewise in accordance with FIG. 1E, a layer 13 of an active solid electrolyte material is deposited above the $Al_2O_3$ layer 12, through the nanopores 14 thereof and the nanopores formed in the resistance layer 10, so that nanopillars 131, 132 and 133 made of the active solid electrolyte material form therein. The active solid electrolyte material of the layer 13 and of the nanopillars 131-133 may be, for example, GeSe and Ag or GeS and Ag.

Figure 1F:
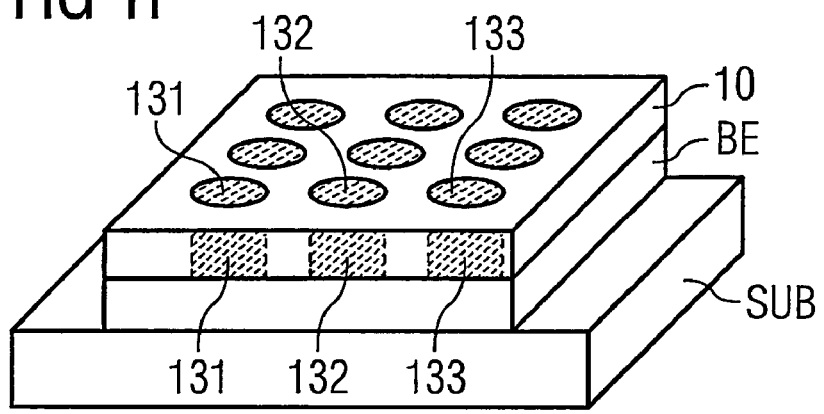
Figure 1G:
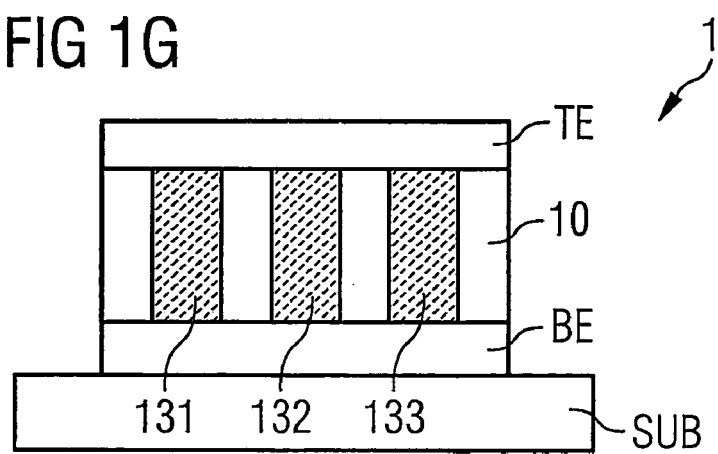

In accordance with FIG. 1F, the aluminum oxide layer 12 lying above the resistance layer 10 with the nanopillars 131-133 of the active solid electrolyte material is subsequently removed, for example, by lift-off or selective etching, the process state illustrated in FIG. 1F being established. Instead of lift-off or selective etching of the Al$_2$O$_3$ layer, it is possible, as an alternative, for the layers 12 and 13 situated above the layer 10 of resistance material to be thinned back by CMP. Finally, in accordance with FIG. 1G, the metallization for the top electrode TE is deposited. It should be mentioned here that the lateral patterning—not illustrated in FIG. 1G—is effected by the embedding of the layer stack in a dielectric layer 15 for the insulation of adjacent cells (cf. FIG. 4). With this insulation and lateral patterning step, the CBRAM memory cell 1 is completed.

Figure 2A:
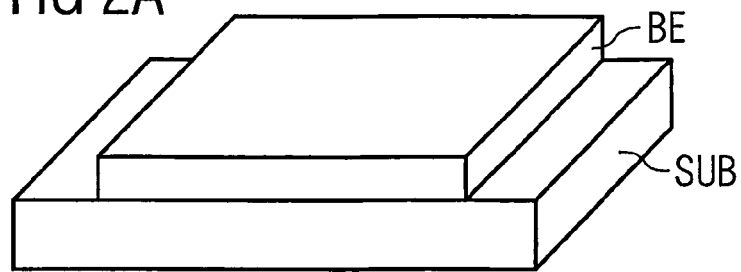
FIGS. 2A-2G illustrate schematic cross-sectional views for elucidating individual process steps of an exemplary embodiment of a fabrication method according to the invention for a CBRAM memory component.
Figure 2B:
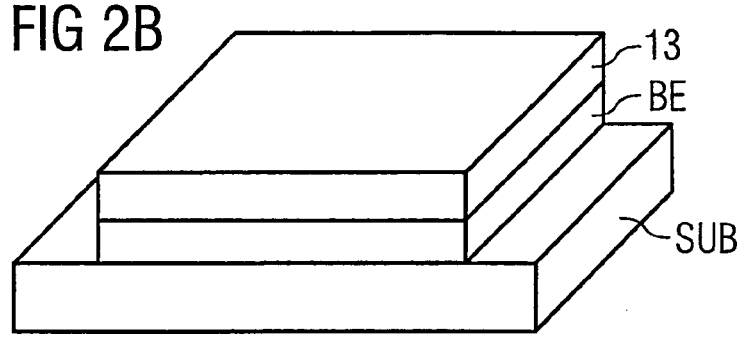
Figure 2C:
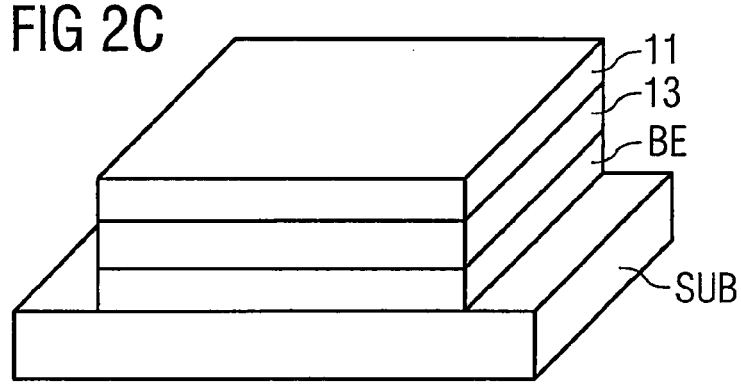
Figure 2D:
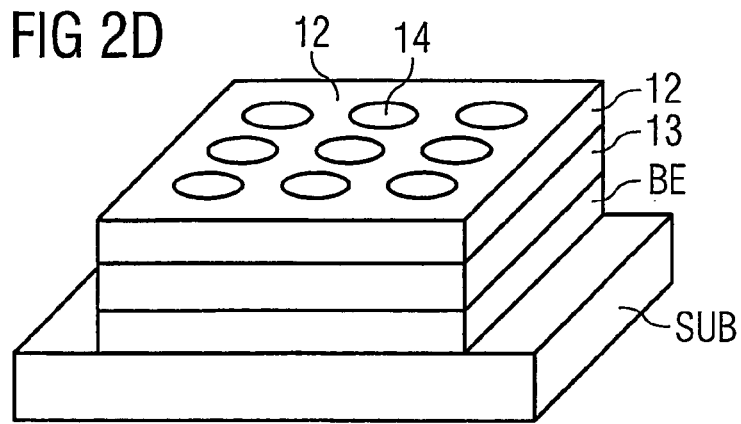

Another exemplary embodiment of a fabrication method according to the invention for a CBRAM memory cell, in which the nanoporous aluminum oxide layer serves as a negative mask, is described below with reference to FIGS. 2A-2G. As in the case of the exemplary embodiment described above, this exemplary embodiment proceeds from the patterned bottom electrode BE, for example, made of W, TiN, TiW, TiAlN or other materials, deposited on a substrate SUB (FIG. 2A). The layer 13 of the active solid electrolyte material, for example, GeSe, GeS and Ag, is subsequently deposited above the bottom electrode BE (FIG. 2B). An aluminum layer 11 is subsequently deposited above the layer 13 of the active solid electrolyte material in accordance with FIG. 2C and anodically oxidized in accordance with FIG. 2D, thereby producing an Al$_2$O$_3$ layer 12 with nanopores 14. Afterward, firstly in accordance with FIG. 2E the layer 13 of the active solid electrolyte material is selectively etched through the nanopores 14 formed in the aluminum oxide layer 12, so that nanopores are likewise produced in the layer 13 of the active material.

Figure 2E:
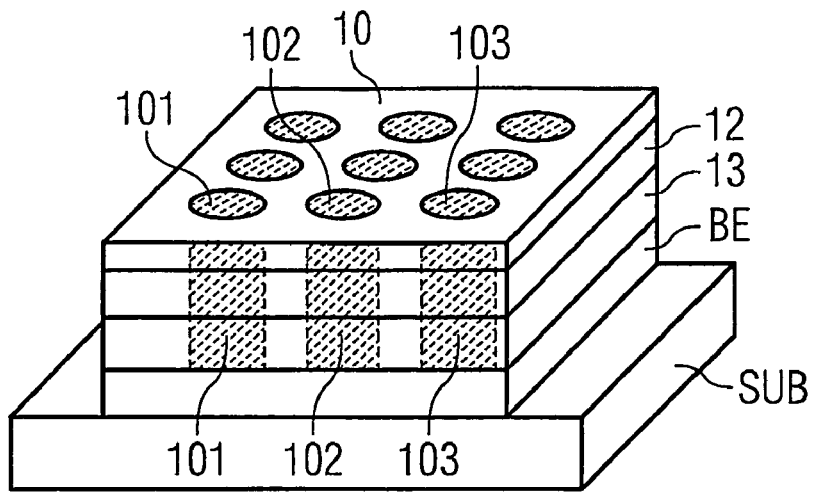
Figure 2F:
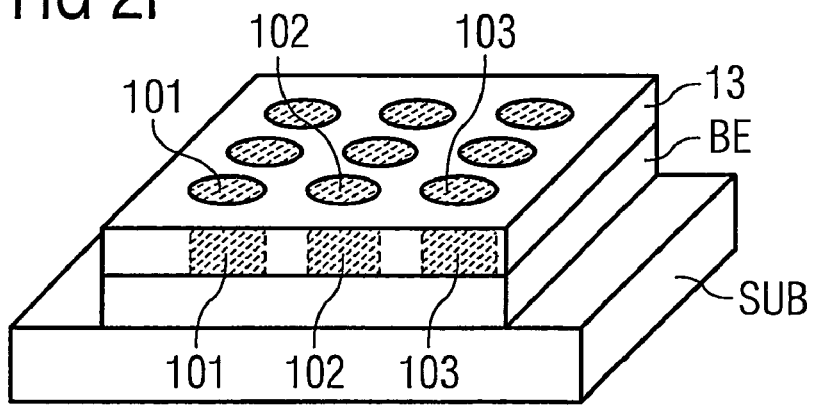
Figure 2G:
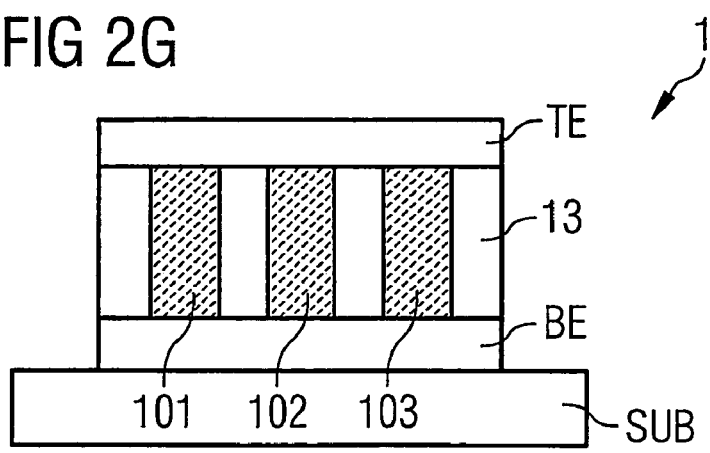

A layer 10 of a resistance material for the parallel resistance is then likewise deposited in accordance with FIG. 2E, to be precise above the aluminum oxide layer 12, through the nanopores 14 thereof and right into the nanopores formed in the active layer 13. This is indicated by the pillars made of resistance material designated by 101, 102 and 103. The resistivity and the geometry of the resistance material, that is to say essentially the number and the diameter of the nanopores within the active layer 13, determine R(off). The resistance material may be, for example, doped polysilicon or TiN. Afterward, the residual aluminum oxide layer 12 is removed in accordance with FIG. 2F, for example, by means of lift-off or selective etching. In this case, the material of the resistance layer 10 above the aluminum oxide layer 12 and in the nanopores thereof is likewise removed. As an alternative, a process of thinning back as far as the active layer 13 may also be performed here by means of CMP. Finally, in accordance with FIG. 2G, the top electrode TE is deposited above the active layer 13 and the nanopillars 101-103 of the resistance material formed therein and is patterned. The CBRAM memory cell 1 fabricated according to the exemplary embodiment in accordance with FIG. 2G is finally patterned laterally by means of the embedding of the layer stack in a dielectric layer 15 as illustrated in FIG. 4 and is thus insulated toward adjacent cells.

The exemplary embodiment described with reference to FIGS. 3A-3G is an alternative to the process described with reference to FIGS. 2A-2G and utilizes a CMP step for patterning the active material. The metallization for the bottom electrode BE that is deposited and patterned on a substrate SUB is once again the starting point in accordance with FIG. 3A. The aluminum layer 11 is then deposited directly on the bottom electrode BE in accordance with FIG. 3B and oxidized anodically to form an Al$_2$O$_3$ layer 12 with the nanopores 14 in accordance with FIG. 3C. The desired diameter of the nanopores 14 is approximately 10 nm in this case as well.

Figure 3A:
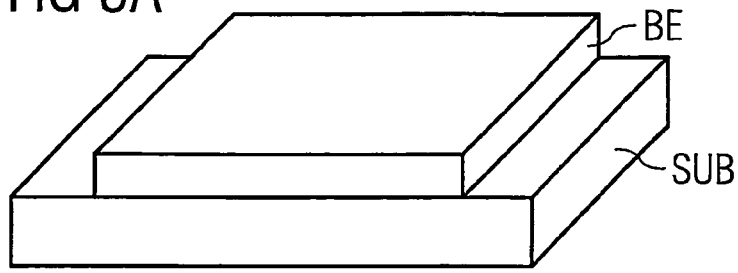
FIGS. 3A-3G illustrate schematic cross-sectional views for elucidating individual process steps of an exemplary embodiment of a fabrication method according to the invention, in which a negative mask in the form of a nanoporous aluminum oxide layer is used in conjunction with a CMP step.
Figure 3B:
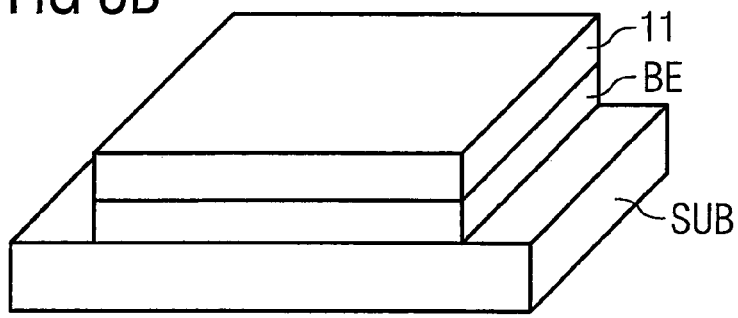
Figure 3C:
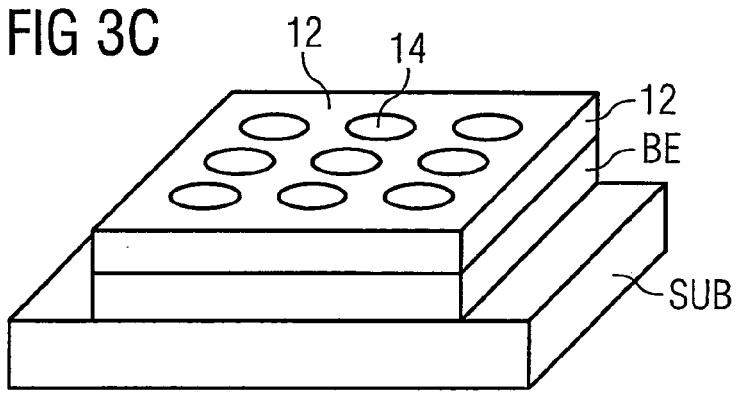
Figure 3D:
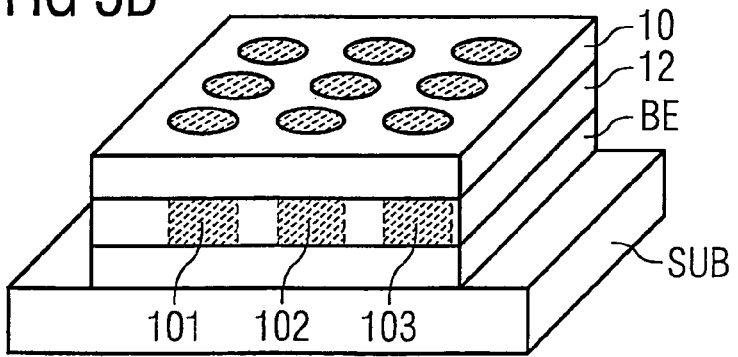
Figure 3E:
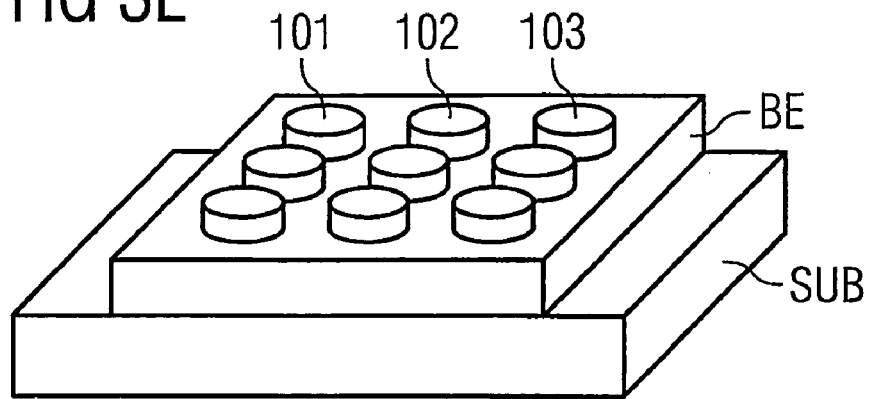
Figure 3F:
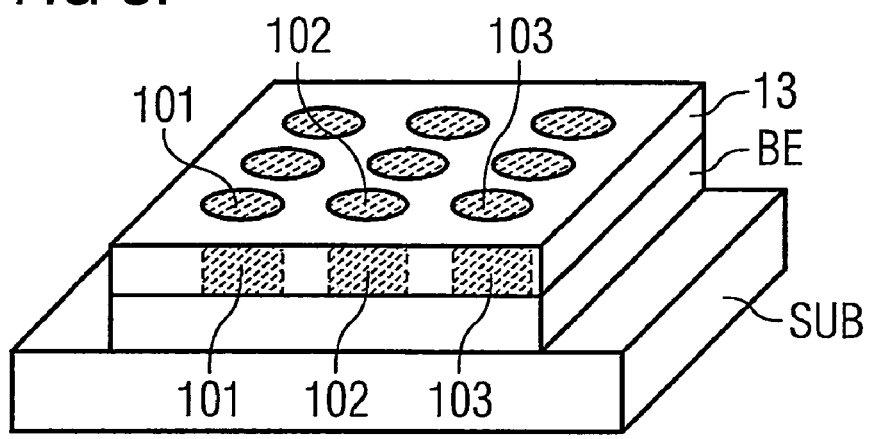
Figure 3G:
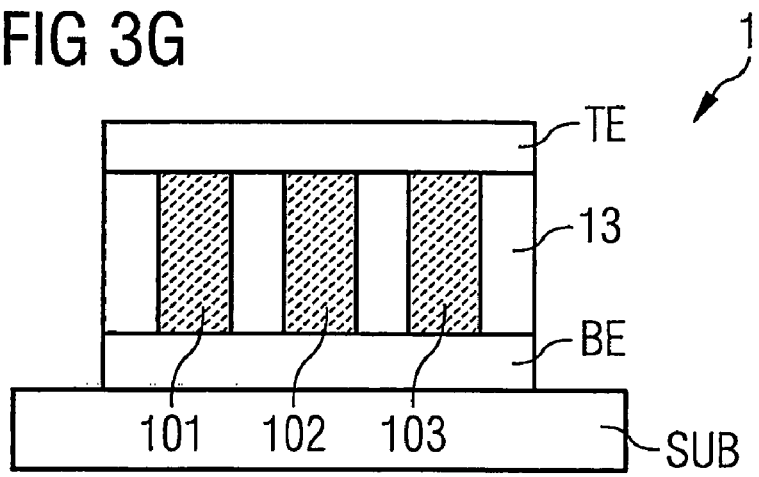

Afterward, in accordance with FIG. 3D, the layer 10 made of resistance material is deposited above the aluminum oxide layer 12 and into the nanopores thereof. The residual aluminum oxide layer 12 is then removed by means of lift-off or selective etching in accordance with FIG. 3E. Nanopillars 101, 102 and 103 of the previously deposited resistance material 10 remain on the bottom electrode BE in this case. In accordance with FIG. 3F, the layer 13 of the active solid electrolyte material is deposited above that and thinned back by means of CMP as far as the nanopillars 101-103 of the resistance material. The metallization for the top electrode TE is then deposited above the active layer 13 in accordance with FIG. 3G. In this exemplary embodiment as well, the off resistance R(off) is determined by the resistivity of the resistance material 10 and the geometry of the nanopillars 101-103 filled with the resistance material 10. Finally, in this case as well, the lateral patterning is effected by embedding the layer stack of the CBRAM memory cell in a dielectric layer 15 for the purpose of insulating adjacent cells (FIG. 4).

A description has been given above, with reference to FIGS. 1A-1G, 2A-3G, 3A-3G and FIG. 4, of exemplary embodiments of a method for fabricating memory components having memory cells based on an active solid electrolyte material which can be changed in terms of its resistance value and which is embedded between a bottom electrode and a top electrode, and which is distinguished by the fact that a resistance material is embedded in parallel with the solid electrolyte material between the bottom and top electrodes. These processes utilize an aluminum layer anodically oxidized in suitable electrolytes, for example, oxalic acid, sulfuric acid, in the case of which homogeneous, hexagonally dense arrangements of nanopores having diameters of down to 4 nm are formed depending on the choice of layer thickness and etching conditions, such as etching time, electrical voltage, chemical concentration of the electrolyte. This aluminum oxide layer with the nanopores serves as a mask for the deposition of the active material and the material for the parallel resistance. The nanoporous aluminum oxide layer served as a positive mask in the case of the exemplary embodiment in accordance with FIGS. 1A-1G, while it is used as a negative mask in the case of the exemplary embodiments in each case in accordance with FIGS. 2A-2G and 3A-3G. With these exemplary embodiments of the fabrication method according to the invention, the off resistance R(off) of the CBRAM cells 1 is defined by the layout and the fabrication method. The off resistance and the ratio R(off)/R(on) are thus no longer determined solely by the material properties, but rather can be adapted to the requirements of the evaluation logic and the desired application. The disadvantages that arise on account of the high value of the off resistance of the electrolyte material in the CBRAM cell can thus be avoided. Furthermore, the ageing effect of the electrolyte material in the CBRAM cells can be suppressed in such a way that it is no longer measurable externally.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A conductive bridging memory component comprising:
    memory cells based on an active solid electrolyte material, which can be changed in terms of its resistance value;

wherein the active solid electrolyte material is embedded between bottom and top electrodes;

wherein the solid electrolyte material is switchable between an off-state with a high resistance and an on-state with a low resistance by comparison therewith upon application of a suitable electrical field between the bottom and top electrodes, said on-state being characterized by formation of a low resistance channel in the high resistance solid electrolyte material; and wherein a resistance material is embedded in addition to the electrolyte material between the bottom and top electrodes in a direct physical contact with both of said bottom and top electrodes so that the electrolyte material completely penetrates through said resistance material, and wherein the resistance value of the resistance material is electrically connected in parallel with the solid electrolyte material between the bottom and top electrodes, the resistance value of the resistance material lying between the resistance values of the active solid electrolyte material in the on-state and in the off-state.

2. The memory component of claim 1, wherein the resistance value of the resistance material is adjustable.

3. The memory component of claim 1, wherein the resistance value of the resistance material is set through a choice of its resistivity.

4. The memory component of claim 1, wherein the resistance value of the resistance material is set by means of a suitable layout of the latter and of the solid electrolyte material between the electrodes.

5. The memory component of claim 1, wherein the electrolyte material is embedded within nanopores extending through the resistance material between said electrodes.

6. The memory component of claim 5, wherein at least one of the number and the diameter of the nanopores are adjusted to set the resistance value of the resistance material.

7. The memory component of claim 1, wherein the resistance material is embedded within nanopores extending through the electrolyte material between said electrodes.

8. The memory component of claim 7, wherein at least one of the number and the diameter of the nanopores are adjusted to set the resistance value of the resistance material.

9. A memory component comprising:
memory cells;
top and bottom electrodes;
conductive bridging means within the memory cells and embedded between the electrodes for changing a resistance value of the conductive bridging means between an on-state with a low resistance and an off-state with a high resistance by forming conductive bridge between the electrodes upon application of an electric field between the electrodes; and
a resistance material embedded in addition to the conductive bridging means between the electrodes in a direct physical contact with both of said electrodes so that the conductive bridging means completely penetrates through said resistance material and the resistance value of the resistance material is electrically connected in parallel to the conductive bridging means within the memory cells between both electrodes, the resistance value of the resistance material lying between the resistance values of the conductive bridging means in the on state and in the off state, respectively of the conductive bridging means.

10. The memory component of claim 9, wherein the resistance value of the resistance material is adjustable.

11. The memory component of claim 9, further including setting the resistance value of the resistance material through a choice of its resistivity.

12. The memory component of claim 9, wherein the resistance value of the resistance material is set by means of a suitable layout of the latter and of a solid electrolyte material between the electrodes.

13. The memory component claim 9, wherein the material of the bottom electrode is selected from a group comprising W, TiN, TiW, and TiAlN.

14. The memory component of claim 9, wherein the resistance material is selected from a group comprising polycrystalline silicon and TiN.

15. The memory component of claim 9, wherein the means for changing the resistance value is a solid electrolyte material that is selected from a group comprising GeSe and Ag and GeS and Ag.

16. The memory component of claim 9, wherein the electrolyte material is embedded within nanopores extending through the resistance material between said electrodes.

17. The memory component of claim 16, wherein at least one of the number and the diameter of the nanopores are adjusted to set the resistance value of the resistance material.

18. The memory component of claim 9, wherein the resistance material is embedded within nanopores extending through the electrolyte material between said electrodes.

19. The memory component of claim 18, wherein at least one of the number and the diameter of the nanopores are adjusted to set the resistance value of the resistance material.

20. A conductive bridging memory component comprising:
memory cells based on an active solid electrolyte material, which can be changed in terms of its resistance value;
wherein the active solid electrolyte material is selected from a group comprising GeSe and Ag and GeS and Ag and is embedded between bottom and top electrodes;
wherein the solid electrolyte material switches between an off-state with a high resistance and an on-state with a low resistance by comparison therewith upon application of a suitable electrical field between the bottom and top electrodes, said on-state being characterized by formation of a low resistance channel in the high resistance solid electrolyte material; and wherein a resistance material is embedded in addition to the electrolyte material between the bottom and top electrodes in a direct physical contact with both of said bottom and top electrodes so that the electrolyte material completely penetrates through said resistance material, and wherein the resistance value of the resistance material is electrically connected in parallel with the solid electrolyte material between the bottom and top electrodes, the resistance value of the resistance material lies between the resistance values of the active solid electrolyte material in the on state and in the off state.

21. A conductive bridging memory component comprising:
memory cells based on an active solid electrolyte material, which can be changed in terms of its resistance value;
wherein the active solid electrolyte material is embedded between bottom and top electrodes;
wherein the solid electrolyte material is switchable between an off-state with a high resistance and an on-state with a low resistance by comparison therewith upon application of a suitable electrical field between the bottom and top electrodes, said on-state being characterized by formation of a low resistance channel in the high resistance solid electrolyte material; and wherein a resistance material is embedded in addition to the electrolyte material between the bottom and top electrodes in a direct physical contact with both of said bottom and top electrodes so that the electrolyte material completely penetrates through said resistance material, wherein the resistance value of the resistance material is electrically connected in parallel with the solid electrolyte material between the bottom and top electrodes, the resistance value of the resistance material lying between the resistance values of the active solid electrolyte material in the on-state and in the off state, and wherein the electrolyte material is embedded within nanopores extending through the resistance material between said electrodes, or wherein the resistance material is embedded within nanopores extending through the electrolyte material between said electrodes.

\* \* \* \* \*